US011372443B2

(12) United States Patent
Sun et al.

(10) Patent No.: US 11,372,443 B2
(45) Date of Patent: Jun. 28, 2022

(54) DISPLAY DEVICE

(71) Applicant: BOE TECHNOLOGY GROUP CO., LTD., Beijing (CN)

(72) Inventors: Rui Sun, Beijing (CN); Zijun Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 866 days.

(21) Appl. No.: 16/304,558

(22) PCT Filed: May 11, 2018

(86) PCT No.: PCT/CN2018/086522
§ 371 (c)(1),
(2) Date: Nov. 26, 2018

(87) PCT Pub. No.: WO2019/037474
PCT Pub. Date: Feb. 28, 2019

(65) Prior Publication Data
US 2021/0026403 A1  Jan. 28, 2021

(30) Foreign Application Priority Data

Aug. 23, 2017  (CN) .......................... 201710731109.6

(51) Int. Cl.
*H04N 1/04* (2006.01)
*G06F 1/16* (2006.01)
*H01L 27/146* (2006.01)
*H01L 27/148* (2006.01)
(Continued)

(52) U.S. Cl.
CPC .......... *G06F 1/1605* (2013.01); *G06F 1/1607* (2013.01); *G06F 1/1639* (2013.01);
(Continued)

(58) Field of Classification Search
CPC .... G06F 1/1605; G06F 1/1607; G06F 1/1639; G06F 1/1686; H01L 27/14643;
(Continued)

(56) References Cited

U.S. PATENT DOCUMENTS

2008/0212150 A1  9/2008  Bremm et al.
2011/0141256 A1  6/2011  Rodriguez et al.
(Continued)

FOREIGN PATENT DOCUMENTS

CN  101287050 A  10/2008
CN  101614948 A  12/2009
(Continued)

OTHER PUBLICATIONS

First Office Action for CN Appl. No. 201710731109.6, dated Jul. 30, 2019.
(Continued)

*Primary Examiner* — Moustapha Diaby
(74) *Attorney, Agent, or Firm* — Dinsmore & Shohl LLP

(57) ABSTRACT

The present application discloses a display device. The display device comprises: a displaying component, an imaging component, and a placement region indicating component, wherein, the imaging component establishes a communication connection with the displaying component, the placement region indicating component is configured to indicate a placement region of an object to be imaged, an imaging region of the imaging component being the placement region as indicated by the placement region indicating component, the imaging component is configured to image the object to be imaged which is located within the placement region, and the displaying component is configured to display an image generated by the imaging component.

20 Claims, 6 Drawing Sheets

(51) Int. Cl.
*H04N 5/225* (2006.01)
*H04N 9/31* (2006.01)
*H04N 1/00* (2006.01)

(52) U.S. Cl.
CPC ...... *G06F 1/1686* (2013.01); *H01L 27/14643* (2013.01); *H01L 27/14806* (2013.01); *H04N 1/00015* (2013.01); *H04N 1/00681* (2013.01); *H04N 5/2251* (2013.01); *H04N 9/3176* (2013.01)

(58) Field of Classification Search
CPC .......... H01L 27/14806; H04N 1/00015; H04N 1/00681; H04N 5/2251; H04N 9/3176
See application file for complete search history.

(56) References Cited

U.S. PATENT DOCUMENTS

| | | |
|---|---|---|
| 2011/0228285 A1 | 9/2011 | Kohara et al. |
| 2015/0189160 A1* | 7/2015 | Auger ................ H04N 5/23216 348/142 |
| 2015/0220114 A1 | 8/2015 | Reznik |
| 2018/0084191 A1* | 3/2018 | Miyoshi .................... G06T 7/70 |

FOREIGN PATENT DOCUMENTS

| | | |
|---|---|---|
| CN | 201422133 Y | 3/2010 |
| CN | 104469068 A | 3/2015 |
| CN | 106231148 A | 12/2016 |
| CN | 206100182 U | 4/2017 |
| WO | 2013177380 A1 | 11/2013 |
| WO | 2015087071 A1 | 6/2015 |

OTHER PUBLICATIONS

International Search Report and Written Opinion for International Appl. No. PCT/CN2018/086522, dated Aug. 2, 2018.
Extended European Search Report dated Apr. 22, 2021, relating to EP Patent Application No. 18803310.4.

* cited by examiner

DISPLAY DEVICE

CROSS-REFERENCE TO RELATED APPLICATIONS

This application is a U.S. National Stage under 35 U.S.C. § 371 of International Application No. PCT/CN2018/086522, filed on May 11, 2018, which claims priority to the Chinese patent application No. 201710731109.6, filed on Aug. 23, 2017. The disclosure of each of these applications is incorporated herein in their entirety by reference.

TECHNICAL FIELD

The present application relates to a display device.

BACKGROUND

With development of science and technology, display devices occur in people's life. A display device has image displaying, storing, and other functions, and generally one display device can display and store multiple images.

In related technologies, a system comprises a display device and an image scanner, and the display device may be connected to the image scanner. When a user needs to use a display device to display an image of an object to be imaged, the user firstly needs to observe, by naked eyes, relative positions of the object to be imaged and the image scanner, and place the object to be imaged within a scan region of the image scanner as much as possible. Then, the user further needs to control the image scanner to scan the scan region so as to generate an image of the object to be imaged, and control the image scanner to transmit the image to the display device, so as to facilitate the displaying of the received image by the display device.

SUMMARY

According to some embodiments of the present disclosure, a display device is provided, comprising: a displaying component, an imaging component, and a placement region indicating component, wherein, the imaging component establishes a communication connection with the displaying component; and the placement region indicating component is configured to indicate a placement region of an object to be imaged, an imaging region of the imaging component being the placement region as indicated by the placement region indicating component, the imaging component is configured to image the object to be imaged which is located within the placement region, the displaying component is configured to display an image generated by the imaging component.

Alternatively, both the imaging component and the placement region indicating component are provided within a non-display region of the displaying component.

Alternatively, the placement region as indicated by the placement region indicating component at least allows the object to be imaged to enter the placement region in a direction of the placement region.

Alternatively, a pattern of the placement region as indicated by the placement region indicating component and a pattern of the display region of the displaying component are similar patterns.

Alternatively, an area of the placement region as indicated by the placement region indicating component is equal to an area of the display region of the displaying component.

Alternatively, the displaying component includes: a display panel and a backlight source.

The imaging component is provided between the display panel and the backlight source, the display region of the displaying component is a display region of the display panel;

a surface of the backlight source, which is close to the display panel, is provided with the placement region indicating component, the imaging component is provided on a surface of the display panel, which is close to the backlight source, and the placement region is located on a surface of the backlight source, which is close to the displaying component;

the placement region indicating component encloses the placement region, and the placement region indicating component is provided with at least one opening through which the object to be imaged can enter the placement region.

Alternatively, the displaying component includes: a display panel, a backlight source, and a base plate.

The display panel and the imaging component is provided on both sides of the backlight source respectively, the base plate is provided on one side of the imaging component, which is far away from the display panel, the display region of the displaying component is the display region of the display panel.

A surface of the backlight source, which is close to the base plate, is provided with the placement region indicating component, the imaging component is provided on a surface of the base plate which is close to the backlight source, and the placement region is located on a surface of the backlight source, which is close to the base plate;

The placement region indicating component encloses the placement region, and the placement region indicating component is provided with at least one opening through which the object to be imaged can enter the placement region.

Alternatively, the placement region indicating component at least includes: a first limit bar and a second limit bar, the placement region is rectangular in shape.

Both the first limit bar and the second limit bar are provided on the backlight source, the first limit bar and the second limit bar are provided in parallel and having identical lengths, the opening is located between the first limit bar and the second limit bar.

A distance between opposite surfaces of the first limit bar and the second limit bar is equal to a length of the display region in a length direction which is perpendicular to the first limit bar, and a length of the first limit bar is equal to a length of the display region in a length direction of the first limit bar.

Alternatively, a length of the imaging component in a direction which is perpendicular to the length direction of the first limit bar and parallel to the display panel is equal to the distance between the opposite surfaces of the first limit bar and the second limit bar.

A length of the imaging component in a length direction of the first limit bar is no greater than the length of the first limit bar, and the imaging component can move along the length direction of the first limit bar.

Alternatively, a photoelectric sensor of the imaging component includes at least one of the following: an optical imaging element based on a Charge Coupled Device (CCD), an optical imaging element based on a Complementary Metal-Oxide-Semiconductor (CMOS), or an optical imaging component based on the CCD and the CMOS; a light source of the imaging component multiplexes a backlight source of the displaying component.

Alternatively, the display device further comprises: a driving component provided on or integrated in the displaying component.

The driving component can be in contact with the object to be imaged to drive the object to be imaged to move within the placement region through the opening.

Alternatively, the driving component includes at least one of the following: a vacuum absorptive object, a mechanical arm, or a roller driving structure provided within the placement region.

Alternatively, a material of at least one of the placement region indicating component and the driving component is a transparent material.

Alternatively, the display device further comprises: a light leakage preventing component, The light leakage preventing component is provided outside of a region in the placement region indicating component, in which no opening is provided, a material of the light leakage preventing component is an opaque material.

Alternatively, the imaging component is an image pickup component, the placement region indicating component is a projecting component.

A projection region of the projecting component is the placement region, both the imaging component and the placement region indicating component are provided on a surface of the displaying component and located in a non-display region of the displaying component.

Alternatively, the image pickup component and the projecting component are provided on a bottom surface of the displaying component.

Alternatively, the image pickup component is a rotatable camera, and the projecting component is a rotatable projector.

Alternatively, the rotatable camera has a view angle changing in a range of 0 to 360 degrees.

Alternatively, the rotatable camera includes: a base, a bracket, a rotatable structure, and an image pickup structure, The base is provided in a non-display region of the displaying component, the bracket is provided on the base, the rotatable structure is flexibly connected to the bracket, the image pickup structure is provided on the rotatable structure.

The rotatable structure is spherical in shape and rotatable on the bracket to drive the image pickup structure to change the view angle.

Alternatively, the display device further comprises: a processor configured to control the displaying component, the imaging component, and the placement region indicating component.

BRIEF DESCRIPTION OF THE DRAWINGS

In order to more clearly illustrate the technical solutions in the embodiments of the present disclosure, the drawings used in the description of the embodiments will be briefly described below. It is obvious that the drawings in the following description are only some embodiments of the present application. For those skilled in the art, other drawings can be obtained according to these drawings without any creative work.

DETAILED DESCRIPTION

To make the objective, technical solutions, and advantages of the present disclosure more clear, a further explanation is made in detail for the embodiments of the present application by combining the drawings.

Figure 1:
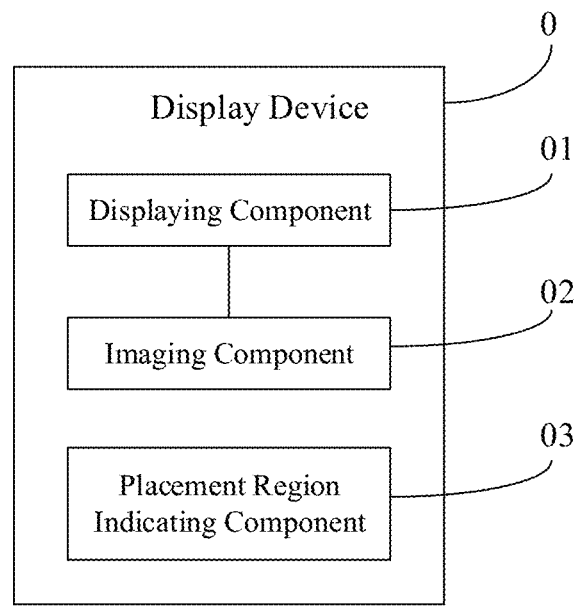
FIG. 1 is a structural schematic diagram of a display device as provided in embodiments of the present disclosure.

FIG. 1 is a structural schematic diagram of a display device as provided in embodiments of the present disclosure. As shown in FIG. 1, the display device 0 may comprise: a displaying component 01, an imaging component 02, and a placement region indicating component 03.

The imaging component 02 establishes a communication connection with the displaying component 01.

The placement region indicating component 03 is configured to indicate a placement region of an object to be imaged. An imaging region of the imaging component 02 may be the placement region as indicated by the placement region indicating component 03. The imaging component 02 may be configured to image the object to be imaged which is located within the placement region. The displaying component 01 is configured to display an image generated by the imaging component 02.

In some embodiments, the imaging component 02 and the placement region indicating component 03 may be structurally integrated with the displaying component 01. In some embodiments, the imaging component 02 and the placement region indicating component 03 may be integrated between inner members within the displaying component 01 or mounted on members of the displaying component 01. In some embodiments, the imaging component 02 and the placement region indicating component 03 may be integrated with an outer frame of the displaying component 01.

To sum up, since the display device as provided in the embodiment of the present disclosure comprises the placement region indicating component which can indicate a placement region of the object to be imaged, when placing the object to be imaged, the user may correctly place, according to an indication of the placement region indicating component, the object to be imaged within the placement region as indicated by the placement region indicating component, so as to enable an image generated by the imaging component to contain the whole object to be imaged. Therefore, an image displayed by the display device can contain the whole object to be imaged, which improves the image display effect.

In addition, the image scanner and the display device in related technologies are two independent structures and difficult to be portable. In contrast, in the display device as provided in embodiments of the present disclosure, the imaging component and the placement region indicating component are integrated with the displaying component, which thus improves the degree to be portable for the display device.

Alternatively, the display device as provided in embodiments of the present disclosure may be an electronic picture frame.

Alternatively, to guarantee an effective display of the image by the displaying component, both the imaging component 02 and the placement region indicating component 03 may be provided in a non-display region of the displaying component 01, so as to prevent the imaging component 02 and the placement region indicating component 03 from shielding the image displayed by the displaying component 01.

Alternatively, the placement region as indicated by the placement region indicating component 03 at least allows the object to be imaged to enter the placement region in a direction of the placement region. A pattern of the placement region as indicated by the placement region indicating component 03 and a pattern of the display region of the displaying component 01 may be similar patterns.

The above-called "similar" means that both have similar geometric shapes. For example, one has a shape of a geometric region A, and the other forms a geometric region B which is a similar scaling of the geometric region A (for example, respective scales corresponding to edges have a difference of no greater than 10%, or respective scales corresponding to edges have a difference of no greater than 5%).

In related technologies, when the image to be displayed by the display device has a different scale from the display region of the display device, the display device needs to clip or fill the image, and then display the clipped or filled image. However, since the original image is clipped or filled, there is a difference on content between the image displayed by the display device and the original image. However, in the embodiments of the present disclosure, since the pattern of the placement region as indicated by the placement region indicating component 03 and the pattern of the display region of the displaying component 01 are similar patterns, a scale of the image generated by the imaging component 02 and a scale of the display region of the displaying component are identical or substantively identical. In this way, the displaying component has no necessity of clipping or filling the image before displaying the image. There is no difference or a small difference on content between the image displayed by the displaying component and the original image.

Alternatively, an area of the placement region as indicated by the placement region indicating component 03 may further be equal to an area of the display region of the displaying component 01, and both form regions having identical geometric shapes. At this time, the pattern of the placement region as indicated by the placement region indicating component 03 is identical with the pattern of the display region of the displaying component 01. In this way, a scale of the image generated by the imaging component 02 is identical with a scale of the display region of the displaying component 01, and the number of pixels as contained in the image generated by the imaging component 02 is identical with the number of pixels in the display region of the displaying component 01. The image displayed by the displaying component 01 is identical with the original image.

In the display device as shown in FIG. 1, the display device may further comprise a processor (not shown in FIG. 1) configured to control the displaying component 01, the imaging component 02, and the placement region indicating component 03. In actual applications, the processor may be one processor or a processor cluster composed of a plurality of processors, for which no limit is made in embodiments of the present disclosure. For example, the processor may be a Central Processing Component (briefly referred to as CPU), a Field-programmable Gate Array (briefly referred to as FPGA), an Application Specific Integrated Circuit (briefly referred to as ASIC), a Microcontroller Component (briefly referred to MCU), or the like.

Figure 2:
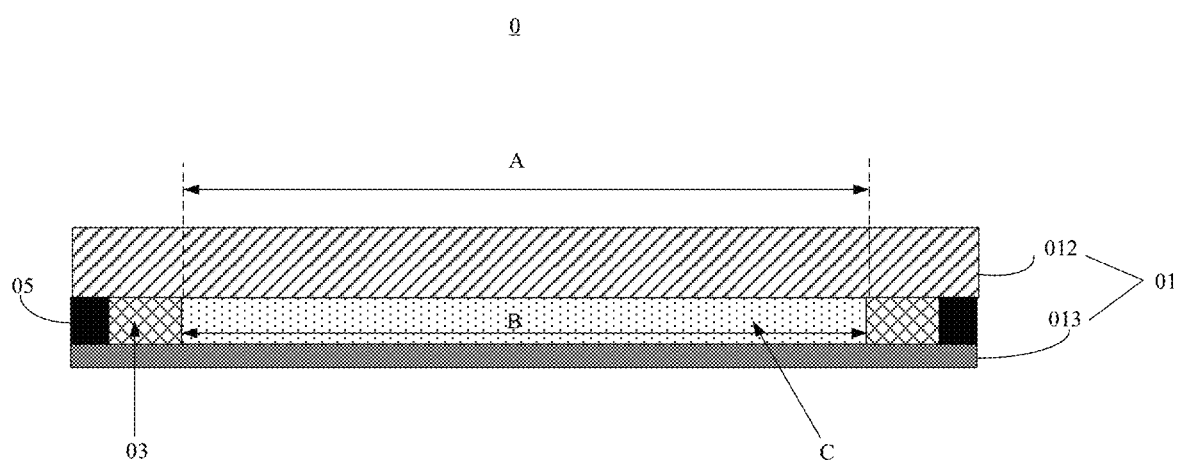
FIG. 2 is a structural schematic diagram of another display device as provided in embodiments of the present disclosure.

FIG. 2 is another structural schematic diagram of the display device as provided in embodiments of the present disclosure. As shown in FIG. 2, by combining FIGS. 1 and 2, the displaying component 01 may include: a display panel 012 and a backlight source 013.

The imaging component 02 (not shown in FIG. 2) is provided between the display component 012 and the backlight source 013. The display region of the displaying component 01 is a display region A of the display panel 012. A surface of the backlight source 013, which is close to the display panel 12, is provided with the placement region indicating component 03. In some embodiments, the imaging component 02 (not shown in FIG. 2) may be provided on a surface of the display panel 012 which is close to the backlight source 013. A placement region B is located on a surface of the backlight source 013 which is close to the displaying component 12. The placement region indicating component 03 can enclose the placement region B, and the placement region indicating component 03 is provided with at least one opening (FIG. 2 shows an opening C) through which the object to be imaged can enter the placement region B.

In embodiments of the present disclosure, the display panel 012 may display an image based on beams emitted from the backlight source 103. The beams emitted from the backlight source 103 may further illuminate an object to be imaged which is located within the placement region B, so as to facilitate the imaging of the object to be imaged by the imaging component 02. That is to say, the display panel 012 and the imaging component 02 may share one backlight source 013. Therefore, it is not needed to provide a respective backlight source for each of the display panel 012 and the imaging component 02 in the display device, rather, it needs to provide only one backlight source in the display device to realize the displaying and imaging functions, so as to reduce a volume and weight of the display device.

In some embodiments, the backlight source 013 may be a direct type backlight source.

Figure 3A:
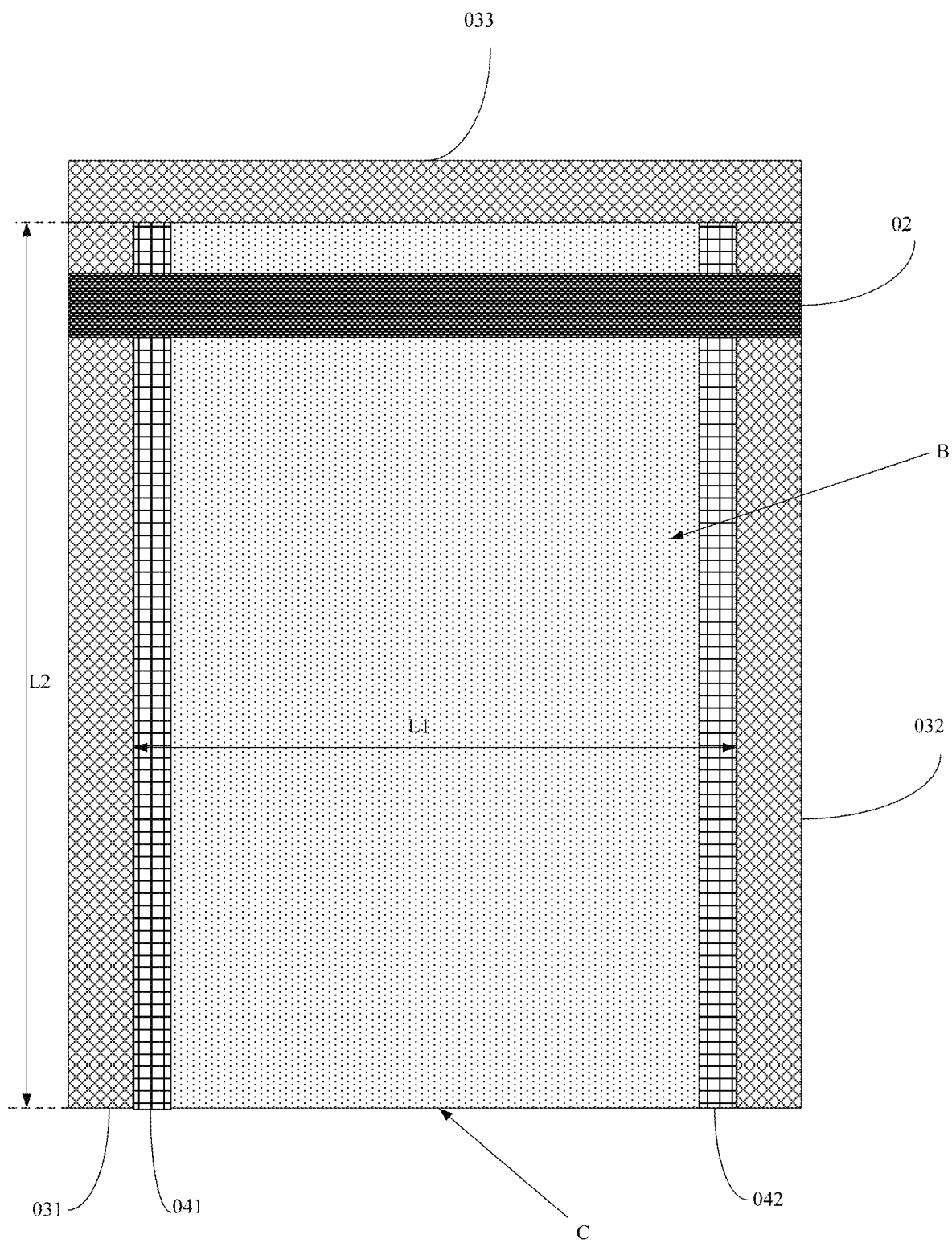
FIG. 3A is a structural schematic diagram of a placement region indicating component as provided in embodiments of the present disclosure.

In some other embodiments, the backlight source 013 may be an edge type backlight source, comprising a light source and a light guide plate, and the light source may be provided on one or more sides of the light guide plate. For example, for a rectangular light guide plate, the light source may be provided on one or more sides of up, down, left, and right sides. Specifically, FIG. 3A is a structural schematic diagram of a placement region indicating component 03 as provided in embodiments of the present disclosure. By combining FIGS. 2 and 3A, the placement region indicating component 03 may include: a first limit bar 031, a second limit bar 032, and a third limit bar 033. The placement region B may be rectangular in shape.

All the first limit bar 031, the second limit bar 032, and the third limit bar 033 are provided on the backlight source 013, and the first limit bar 031 and the second limit bar 032 are provided in parallel and have identical lengths. Both one end of the first limit bar 031 and one end of the second limit bar 032 extend to an edge of the backlight source 013, both the other end of the first limit bar 031 and the other end of the second limit bar 032 are provided with the third limit bar 033. An opening C provided on the placement region indicating component 03 may be located between the one end of the first limit bar 031 and the one end of the second limit bar 032. A distance L1 between opposite surfaces of the first limit bar 031 and the second limit bar 032 may be equal to a length of the display region A of the display panel 012 in a length direction which is perpendicular to the first limit bar 031, and a length L2 of the first limit bar 032 is equal to a length of the display region A of the display panel 012 in a length direction of the first limit bar 031.

A length of the imaging component 02 in a direction which is perpendicular to the length direction of the first limit bar 031 and parallel to the display panel is equal to the distance L1 between opposite surfaces of the first limit bar 031 and the second limit bar 032. A length of the imaging component 02 in a length direction of the first limit bar 031 is no greater than (that is, less than or equal to) the length L2 of the first limit bar 031, and the imaging component 02 can move along the length direction of the first limit bar 031. That is to say, the imaging component 02 in embodiments of the present disclosure has a small volume, and can scan the object to be imaged by moving.

For example, the imaging component 02 may include, but be not limited to, an optical imaging element based on a Charge Coupled Device (briefly referred to as CCD), an optical imaging element based on a Complementary Metal-Oxide-Semiconductor (briefly referred to as CMOS), or an optical imaging component based on the CCD and the CMOS.

For example, the imaging component 02 may be a scanner. The imaging component 02 may include a reflective scanner, a transmissive scanner, and a multi-purpose scanner which can scan not only a reflective draft but also a transmissive draft.

The display panel 012 may be a Liquid Crystal Display (briefly referred to as LCD), an Organic Light-Emitting Diode (briefly referred to as OLED) display panel, any other Flat Panel Display (briefly referred to as FPD), or the like, each of which is applicable to the technical solution of the present disclosure. In particular, any other FPD may be a Quantum Dot Light Emitting Diodes (briefly referred to as QLED) display panel. Alternatively, the display device 0 may further comprise: a driving component (not shown in FIG. 2) provided on or integrated in the displaying component 01. The driving component can be in contact with the object to be imaged to drive the object to be imaged to move within the placement region B through the opening C. Alternatively, the driving component may include: a vacuum absorptive object, a mechanical arm, or a roller driving structure provided within the placement region B.

By combining FIGS. 2 and 3A, when the driving component is the roller driving structure provided within the placement region B, the roller driving structure may include: a first roller driving belt 041 and a second roller driving belt 042. The first roller driving belt 041 is parallel to the second roller driving belt 042, and the first roller driving belt 041 and the second roller driving belt 042 are oppositely provided on one side of the backlight source 013 which is close to the light guide plate 011 within the placement region. The user may place the object to be imaged at the opening C, and the first roller driving belt 041 and the second roller driving belt 042 drive the object to be imaged to move to the placement region B.

Figure 3B:
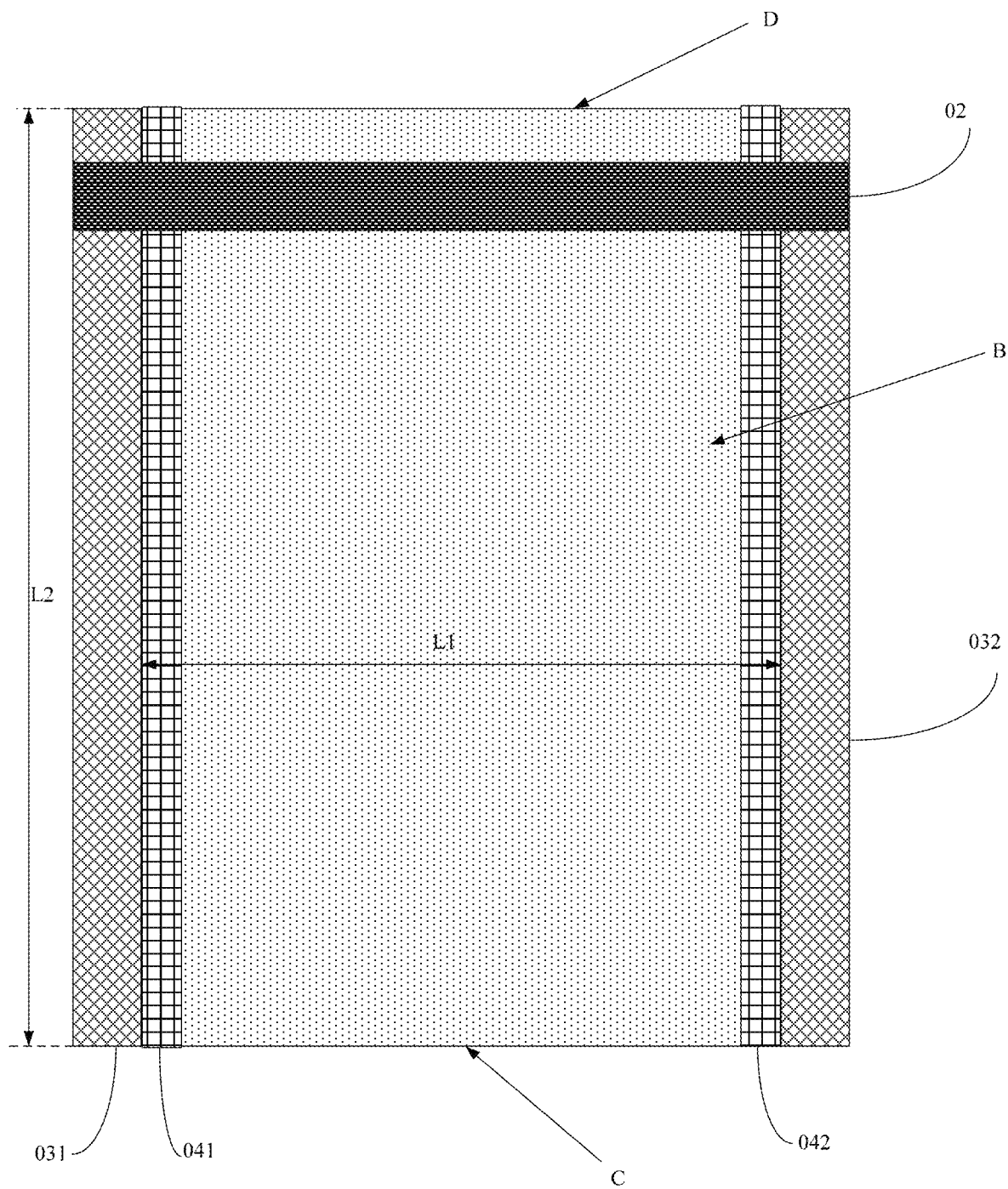
FIG. 3B is a structural schematic diagram of another placement region indicating component as provided in embodiments of the present disclosure.

Alternatively, FIG. 3B is a structural schematic diagram of another placement region indicating component 03 as provided in embodiments of the present disclosure. By combining FIGS. 2 and 3B, the placement region indicating component 03 may include: a first limit bar 031 and a second limit bar 032. The placement region B may be rectangular in shape.

Both the first limit bar 031 and the second limit bar 032 are provided on the backlight source 013, and the first limit bar 031 and the second limit bar 032 are provided in parallel and have identical lengths. Both ends of the first limit bar 031 and both ends of the second limit bar 032 each extend to edges of the backlight source 031. Two openings C and D provided on the placement region indicating component 03 each may be located between the first limit bar 031 and the second limit bar 032 (for example, the opening C is located between one end of the first limit bar 031 and one end of the second limit bar 032, and the opening D is located between the other end of the first limit bar 031 and the other end of the second limit bar 032). A distance L1 between opposite surfaces of the first limit bar 031 and the second limit bar 032 may be equal to a length of the display region A of the display panel 012 in a length direction which is perpendicular to the first limit bar 031, and a length L2 of the first limit bar 032 is equal to a length of the display region A of the display panel 012 in a length direction of the first limit bar 031.

A length of the imaging component 02 in a direction which is perpendicular to the length direction of the first limit bar 031 and parallel to the display panel is equal to the distance L1 between opposite surfaces of the first limit bar 031 and the second limit bar 032. In some embodiments, the imaging component 02 can move along the length direction of the first limit bar 031 in a length direction of the first limit bar 031. That is to say, the imaging component 02 in embodiments of the present disclosure has a small volume, and can scan the object to be imaged by moving.

Alternatively, the display device 0 of FIG. 3B may further comprise: a driving component (not shown in FIG. 2) provided on the displaying component 01. The driving component can be in contact with the object to be imaged to drive the object to be imaged to unidirectionally move within the placement region B sequentially through the openings C and D, for example, enter the placement region B through one of the openings C and D and exit from the placement region B through the other opening. In such circumstance, the imaging component 02 may be fixed and scan the object to be imaged during movement of the object to be imaged. Alternatively, the driving component may include: a vacuum absorptive object, a mechanical arm, or a roller driving structure provided within the placement region B.

By combining FIGS. 2 and 3B, when the driving component is a roller driving structure provided within the placement region B, the roller driving structure may include: a first roller driving belt 041 which is oppositely provided on one side of the backlight source 013 which is close to the light guide plate 011 within the placement region. The user may provide the object to be imaged at the opening C, and the first roller driving belt 041 drives the object to be imaged to move to another opening D of the placement region B in a length direction.

In embodiments of the present disclosure, by moving the imaging component, a structural design of the product may be simplified, and a thickness of the device may be reduced. By moving the object to be imaged, a failure rate of the imaging component may be reduced, and a use stability of the product may be improved. In actual applications, the imaging component and the object to be imaged may be simultaneously set to be movable in one display device.

For example, in the display device as provided in embodiments of the present disclosure, a material of at least one of the placement region indicating component 03 and the driving component may be a transparent material. Alternatively, a material of either of the placement region indicating component 03 and the driving component is a transparent material. Since either of the placement region indicating component 03 and the driving component 04 is provided between a light source layer 013 and a light guide plate 011 of the display device, to reduce, as much as possible, an effect of the placement region indicating component 03 and the driving component 04 on light emitted from the light source layer 013, a material of at least one of the placement region indicating component 03 and the driving component 04 may be set as a transparent material.

Continuing to refer to FIG. 2, the display device 0 may further comprise: a light leakage preventing component 05. The light leakage preventing component 05 is provided outside of a region in the placement region indicating component 03, in which no opening C is provided. A material of the light leakage preventing component 05 may be an opaque material. The light leakage preventing component 05 can prevent beams emitted from the light source layer 013 from exiting between the light source layer 013 and light guide plate 011, so as to improve a utilization rate of beams emitted from the light source layer 013 by the display device.

When it is needed to image the object to be imaged, the object to be imaged may be provided at an opening of the placement region indicating component, and as driven by the driving component, enter a placement region as indicated by the replacement region indicating component. Then, the imaging component may generate an image of the object to be imaged within the placement region, and transmit the generated image to the displaying component, so as to facilitate the displaying of the image of the object to be imaged by the displaying component. The displaying component may further store the image of the object to be imaged.

It should be noted that, since the object to be imaged can enter, only from the opening, the placement region enclosed by the placement region indicating component, when the object to be imaged has a large volume, the object to be imaged cannot enter the placement region through the opening, which thus prevents the display device from displaying an image having a large area (larger than the display region) and prevents the display device from displaying a distorted image.

For example, when the object to be imaged is a picture having a length of 15 cm and a width of 8 cm and the placement region has a length of 15 cm and a width of 10 cm, the user may place one end, at which the width of the picture resides, into the placement region through the opening. At this time, the imaging component can image the picture within the placement region, and the generated image includes: an image of the picture and an image of the blank region (a region of the placement region in which no picture is placed). When the displaying component displays the image generated by the imaging component, the image of the blank region may be interpolated, and the interpolated image may be displayed (include the image of the picture and the image of the interpolated blank region), such that it can be guaranteed that the image of the picture displayed by the displaying component is not distorted.

Figure 4:
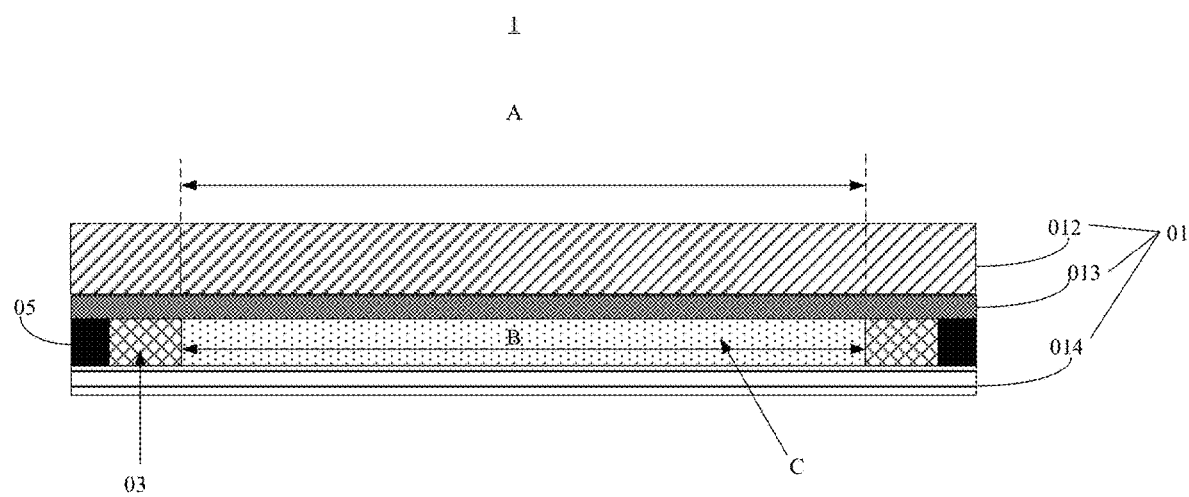
FIG. 4 is a structural schematic diagram of a further display device as provided in embodiments of the present disclosure.

FIG. 4 is a structural schematic diagram of a further display device 1 as provided in embodiments of the present disclosure. As shown in FIG. 4, by combining FIGS. 1 and 4, the displaying component 01 may include: a display panel 012, a backlight source 013, and a base plate 014.

The display panel 012 and the imaging component 02 (not shown in FIG. 4) are provided on both sides of the backlight source 013 respectively. The display region of the displaying component 01 is a display region A of the display panel 012. A surface of the backlight source 013, which is close to the base plate 014, may be provided with the placement region indicating component 03. The imaging component 02 (not shown in FIG. 2) is provided on a surface of the base plate 014 which is close to the backlight source 013. A placement region B is located on a surface of the backlight source 013 which is close to the base plate 014. The placement region indicating component 03 can enclose the placement region B, and the placement region indicating component 03 is provided with an opening C through which the object to be imaged can enter the placement region B. The object to be imaged can further exit from the placement region B through the opening C.

Alternatively, similar to what is described with reference to FIG. 3, the display device 1 may further comprise: a driving component (not shown in FIG. 4) provided on the displaying component 01. For example, the driving component may be provided within the placement region on one side of the base plate 014 which is close to the backlight source 013. The driving component can be in contact with the object to be imaged to drive the object to be imaged to move within the placement region B through the opening C.

Alternatively, the placement region indicating component 03 may be provided with two openings (refer to openings C and D as shown in FIG. 3B). At this time, the object to be imaged may enter the placement region B through the opening C, and exit from the placement region B through the opening D.

In embodiments of the present disclosure, the display panel 012 may display an image based on beams emitted from the backlight source 013. The beams emitted from the backlight source 103 may further illuminate an object to be imaged which is located within the placement region B, so as to facilitate the imaging of the object to be imaged by the imaging component 02. That is to say, the display panel 012 and the imaging component 02 may share one backlight source 013. Therefore, it is not needed to provide a respective backlight source for each of the display panel 012 and the imaging component 02 in the display device, rather, it needs to provide only one backlight source in the display device to realize the displaying and imaging functions, so as to reduce a volume and weight of the display device.

For example, in the display device as provided in embodiments of the present disclosure, a material of at least one of the placement region indicating component 03 and the driving component may be transparent material. Continuing to refer to FIG. 4, the display device 0 may further comprise: a light leakage preventing component 05, the light leakage preventing component 05 is provided outside of a region in the placement region indicating component 03, in which no opening C is provided. A material of the light leakage preventing component 05 may be an opaque material.

It should be noted that, a specific structure of the placement region indicating component 03 and a specific structure of the imaging component 02 in embodiments of the present disclosure may refer to the specific structure of the placement region indicating component 03 and the specific structure of the imaging component 02 in the display device as shown in FIG. 2. The method of using the display device may also refer to the method of using the display device as shown in FIG. 2. No further comment is given in embodiments of the present disclosure.

Figure 5:
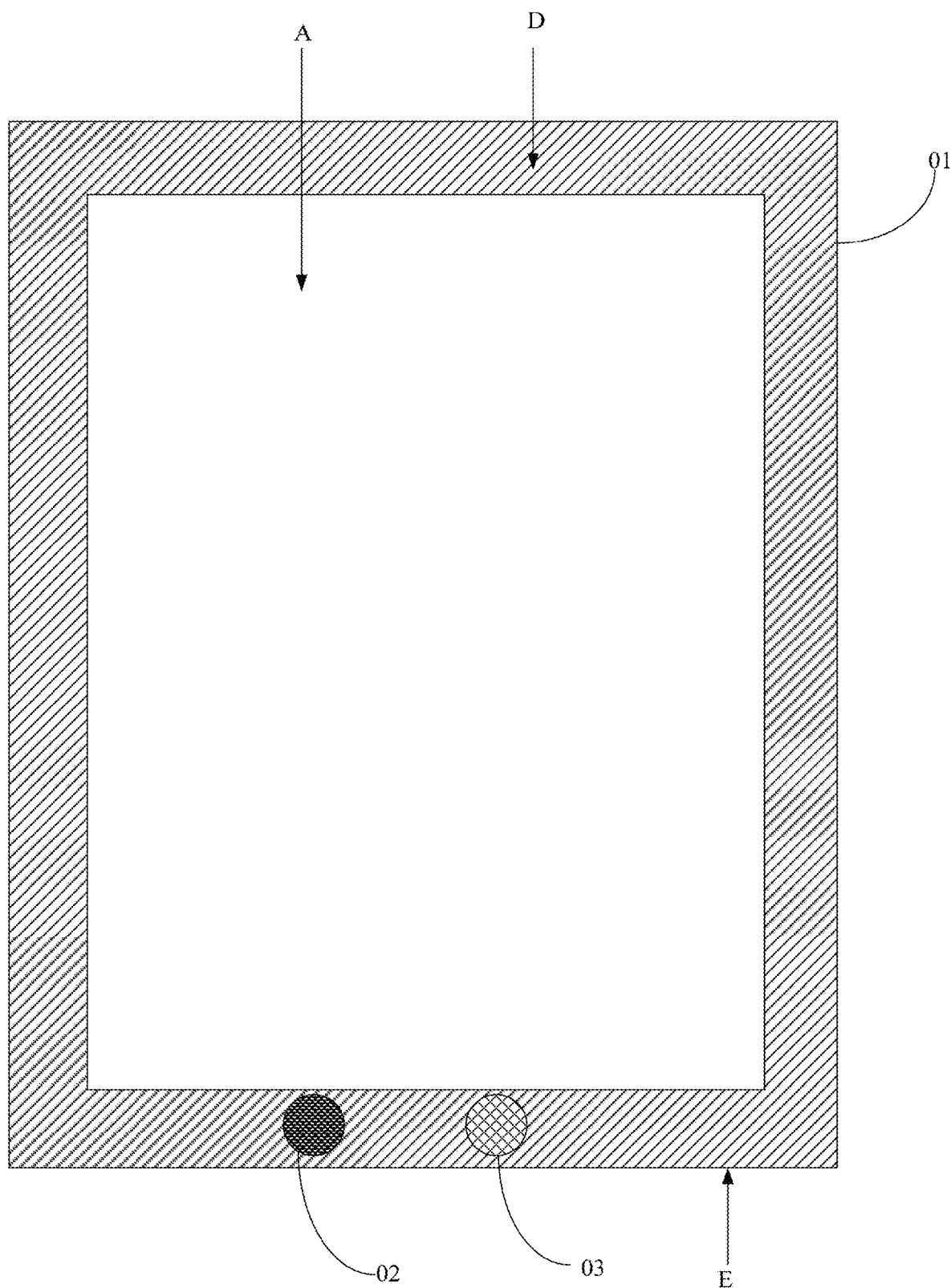
FIG. 5 is a structural schematic diagram of a further display device as provided in embodiments of the present disclosure.

FIG. 5 is a structural schematic diagram of a further display device as provided in embodiments of the present disclosure. As shown in FIG. 5, the imaging component 02 may be an image pickup component, the placement region indicating component 03 may be a projecting component, and the projection region of the projecting component may be a placement region. That is to say, in embodiments of the present disclosure the projecting component is used to project the placement region so as to indicate a size, shape and position of the placement region, and the image pickup component may be used to pick up an image of the object to be imaged within the placement region so as to generate an image of the object to be imaged.

Both the imaging component 02 and the placement region indicating component 03 may be provided on a surface of the displaying component 01, and located in a non-display region D (any region other than the display region A) of the displaying component 01. As shown in FIG. 5, both the imaging component 02 and the placement region indicating component 03 may be provided or integrated within an outer frame of the displaying component 01.

Figure 6:
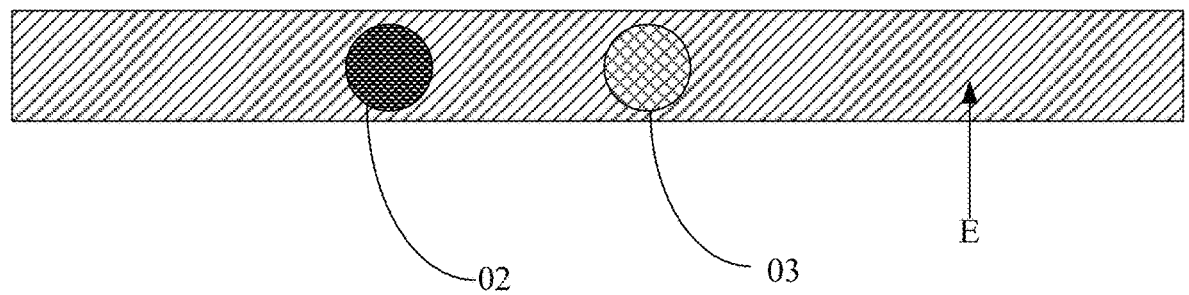
FIG. 6 is a schematic diagram of positions at which an imaging component and a placement region indicating component as provided in embodiments of the present disclosure are provided.

FIG. 6 is a schematic diagram of positions at which an imaging component 02 and a placement region indicating component 03 as provided in embodiments of the present disclosure are provided. FIG. 6 shows a top view of the display device. As shown in FIG. 6, when the imaging component 02 is an image pickup component (e.g. a camera) and the placement region indicating component 03 is a projecting component (e.g. a projector), both the image pickup component and the projecting component may be provided on a bottom surface E (a specific position of the bottom surface E may refer to a position of the bottom surface E as shown in FIG. 5) of the displaying component 01. It should be noted that, when the displaying component 01 hangs on the wall, the bottom surface of the displaying component 01 is a surface of the displaying component 01 which is close to the ground. At this time, the placement region as indicated by the placement region indicating component 03 may be located on the ground, and the user may directly place the object to be imaged within the placement region on the ground so as to facilitate the generation of an image of the object to be imaged by the imaging component.

Alternatively, the image pickup component in embodiments of the present disclosure may be a rotatable camera, and the projecting component may be a rotatable projector. For example, the camera has a view angle changing in a range of 0 to 360 degrees. Since the image pickup component is a rotatable camera and the projecting component is a rotatable projector, the placement region as indicated by the projecting component may be located at any position, and regardless of any position at which the placement region as indicated by the projecting component is located, the image pickup component can generate an image of the object to be imaged within the placement region as indicated by the projecting component. Coordination between both of the projecting component and the image pickup component may be achieved by a communication connection. For example, the central processing component acquires a region and angle of projection of the projecting component so as to adjust the image pickup component to face the placement region as indicated by the projecting component for imaging.

Figure 7:
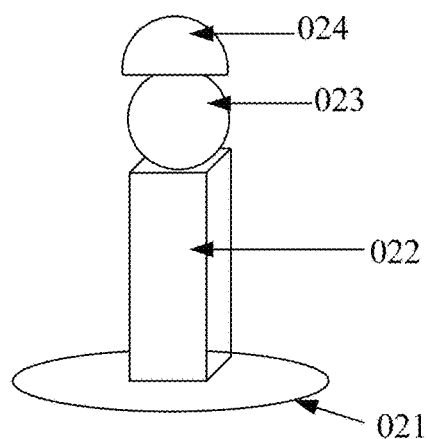
FIG. 7 is a structural schematic diagram of a rotatable camera as provided in embodiments of the present disclosure.

FIG. 7 is a structural schematic diagram of a rotatable camera as provided in embodiments of the present disclosure. As shown in FIG. 7, the rotatable camera may include: a base 021, a bracket 022, a rotatable structure 023, and an image pickup structure 024. The base 021 is provided in a non-display region of the displaying component, the bracket 022 is provided on the base 021, the rotatable structure 023 is flexibly connected to the bracket 022, and the image pickup structure 024 is provided on the rotatable structure 023. The rotatable structure 023 is spherical in shape and rotatable on the bracket 022 to drive the image pickup structure 024 to rotate so as to change the view angle of the image pickup structure 24. The image pickup structure 024 may be a high definition image pickup structure.

When it is needed to image the object to be imaged, the object to be imaged may be placed within a projection region of the projecting component. Then, the image pickup component may generate an image of the object to be imaged, and transmit the generated image to the displaying component, so as to facilitate the displaying of the image of the object to be imaged by the displaying component. The displaying component may further store the image of the object to be imaged.

To sum up, since the display device as provided in embodiments of the present disclosure comprises a placement region indicating component which can indicate a placement region of the object to be imaged, when placing the object to be imaged, the user may correctly place, according to an indication of the placement region indicating component, the object to be imaged within the placement region as indicated by the placement region indicating component, so as to enable an image generated by the imaging component to contain the whole object to be imaged. Therefore, an image displayed by the display device can contain the whole object to be imaged, which improves the image display effect.

In addition, in the display device as provided in embodiments of the present disclosure, both the imaging component and the placement region indicating component may be mounted on the displaying component, which thus improves the degree to be portable for the display device.

The above description is only optional embodiments of the present application, and is not intended to limit the present application. Any modifications, equivalent replacements, improvements, etc. made within the spirit and principles of the present application are included in the protection scope of the present application.

What is claimed is:

1. A display device, comprising: a displaying component, an imaging component, and a placement region indicating component, wherein the imaging component and the placement region indicating component are integrated structurally with the displaying component;

wherein the imaging component establishes a communication connection with the displaying component; and wherein the placement region indicating component encloses a placement region of an object to be imaged and the placement region indicating component is provided with at least one opening through which the object to be imaged can enter the placement region, an imaging region of the imaging component being the placement region as indicated by the placement region indicating component, the imaging component is configured to image the object to be imaged which is located within the placement region, the displaying component is configured to display an image generated by the imaging component.

2. The display device according to claim 1, wherein both the imaging component and the placement region indicating component are provided within a non-display region of the displaying component.

3. The display device according to claim 1, wherein the placement region as enclosed by the placement region indicating component at least allows the object to be imaged to enter the placement region in a direction of the placement region.

4. The display device according to claim 1, wherein a pattern of the placement region as enclosed by the placement region indicating component and a pattern of a display region of the displaying component are similar patterns.

5. The display device according to claim 4, wherein an area of the placement region as enclosed by the placement region indicating component is equal to an area of the display region of the displaying component.

6. The display device according to claim 1, wherein the displaying component includes: a display panel and a backlight source,
the imaging component being provided between the display panel and the backlight source, a display region of the displaying component being a display region of the display panel;
a surface of the backlight source, which is close to the display panel, is provided with the placement region indicating component, the imaging component is provided on a surface of the display panel, which is close to the backlight source, and the placement region is located on a surface of the backlight source, which is close to the displaying component.

7. The display device according to claim 6, wherein the placement region indicating component at least includes: a first limit bar and a second limit bar, the placement region being rectangular in shape,
both the first limit bar and the second limit bar being provided on the backlight source, the first limit bar and the second limit bar being provided in parallel and having identical lengths, the at least one opening being located between the first limit bar and the second limit bar;
a distance between opposite surfaces of the first limit bar and the second limit bar is equal to a length of the display region in a length direction which is perpendicular to the first limit bar, and a length of the first limit bar is equal to a length of the display region in a length direction of the first limit bar.

8. The display device according to claim 7, wherein:
a length of the imaging component in a direction which is perpendicular to the length direction of the first limit bar and parallel to the display panel is equal to the distance between the opposite surfaces of the first limit bar and the second limit bar;
a length of the imaging component in a length direction of the first limit bar is no greater than the length of the first limit bar, and the imaging component can move along the length direction of the first limit bar.

9. The display device according to claim 8, wherein:
a photoelectric sensor of the imaging component includes at least one of the following:
an optical imaging element based on a Charge Coupled Device (CCD);
an optical imaging element based on a Complementary Metal-Oxide-Semiconductor (CMOS); or
an optical imaging component based on the CCD and the CMOS;
a light source of the imaging component multiplexes a backlight source of the displaying component.

10. The display device according to claim 1, further comprising a display panel, a backlight source, and a base plate,
the display panel and the imaging component being provided on both sides of the backlight source respectively, the base plate being provided on one side of the imaging component, which is far away from the display panel, a display region of the displaying component being the display region of the display panel;
a surface of the backlight source, which is close to the base plate, is provided with the placement region indicating component, the imaging component is provided on a surface of the base plate which is close to the backlight source, and the placement region is located on a surface of the backlight source, which is close to the base plate.

11. The display device according to claim 6, further comprising: a driving component provided on or integrated in the displaying component, wherein the driving component can be in contact with the object to be imaged to drive the object to be imaged to move within the placement region through the at least one opening.

12. The display device according to claim 11, wherein the driving component includes at least one of the following: a vacuum absorptive object, a mechanical arm, or a roller driving structure provided within the placement region.

13. The display device according to claim 11, wherein a material of at least one of the placement region indicating component and the driving component is a transparent material.

14. The display device according to claim 6, further comprising: a light leakage preventing component,
the light leakage preventing component being provided outside of a region in the placement region indicating component, in which no opening is provided, a material of the light leakage preventing component being an opaque material.

15. The display device according to claim 1, wherein the imaging component is an image pickup component, the placement region indicating component is a projecting component,
a projection region of the projecting component is the placement region, both the imaging component and the placement region indicating component are provided on a surface of the displaying component and located in a non-display region of the displaying component.

16. The display device according to claim 15, wherein the image pickup component and the projecting component are provided on a bottom surface of the displaying component.

17. The display device according to claim 15, wherein the image pickup component is a rotatable camera, and the projecting component is a rotatable projector.

18. The display device according to claim 17, wherein the camera has a view angle changing in a range of 0 to 360 degrees.

19. The display device according to claim 18, wherein the camera includes: a base, a bracket, a rotatable structure, and an image pickup structure, the base being provided in a non-display region of the displaying component, the bracket being provided on the base, the rotatable structure being flexibly connected to the bracket, the image pickup structure being provided on the rotatable structure;

the rotatable structure is spherical in shape and rotatable on the bracket to drive the image pickup structure to change the view angle.

20. The display device according to claim 1, further comprising: a processor configured to control the displaying component, the imaging component, and the placement region indicating component.

* * * * *